US012676452B2

(12) United States Patent
Choi et al.

(10) Patent No.: US 12,676,452 B2
(45) Date of Patent: Jul. 7, 2026

(54) INTEGRATED LIGHT RECEIVING AND EMITTING DEVICE COMBINED WITH CONTROL CIRCUIT WAFER AND METHOD THEREOF

(71) Applicant: RESEARCH & BUSINESS FOUNDATION SUNGKYUNKWAN UNIVERSITY, Suwon-si (KR)

(72) Inventors: Byoung Lyong Choi, Seoul (KR); Dong Mok Whang, Suwon-si (KR); Sung Won Moon, Gunpo-si (KR); Tae Jun Gu, Seongnam-si (KR)

(73) Assignee: Research & Business Foundation Sungkyunkwan University, Suwon-si (KR)

( * ) Notice: Subject to any disclaimer, the term of this patent is extended or adjusted under 35 U.S.C. 154(b) by 1063 days.

(21) Appl. No.: 17/527,765

(22) Filed: Nov. 16, 2021

(65) Prior Publication Data

US 2022/0200234 A1     Jun. 23, 2022

(30) Foreign Application Priority Data

Nov. 16, 2020     (KR) ......................... 10-2020-0153154

(51) Int. Cl.
*H01S 5/026*          (2006.01)
*G01S 7/481*          (2006.01)
(Continued)

(52) U.S. Cl.
CPC .......... *H01S 5/0262* (2013.01); *G01S 7/4812* (2013.01); *H01S 5/02253* (2021.01); *H01S 5/0239* (2021.01); *H01S 5/042* (2013.01)

(58) Field of Classification Search
CPC ............................. H01S 5/0239; H01S 5/0262
See application file for complete search history.

(56) References Cited

U.S. PATENT DOCUMENTS

| | | | | |
|---|---|---|---|---|
| 7,446,293 | B2 * | 11/2008 | Kaneko | H01S 5/18388 |
| | | | | 257/E27.12 |
| 2011/0019709 | A1 * | 1/2011 | Masui | H01L 24/24 |
| | | | | 257/E31.113 |
| 2020/0127441 | A1 * | 4/2020 | Ghosh | H01S 5/02325 |

FOREIGN PATENT DOCUMENTS

| | | |
|---|---|---|
| JP | 2005-045049 A | 2/2005 |
| JP | 2005-311286 A | 11/2005 |

(Continued)

OTHER PUBLICATIONS

Korean Office Action issued on Apr. 23, 2022, in the counterpart Korean Application No. 10- 2020-0153154 (5 pages in Korean).

(Continued)

*Primary Examiner* — Michael Carter
(74) *Attorney, Agent, or Firm* — NSIP Law

(57) ABSTRACT

The present disclosure relates to an integrated light receiving and emitting device combined with a control circuit wafer and a manufacturing method thereof. The integrated light receiving and emitting device combined with a control circuit wafer according to an exemplary embodiment of the present disclosure includes: a light receiving and emitting unit which has an integrated wafer structure in which a light emitting unit and a light receiving unit are vertically formed on one surface of a single semiconductor substrate by wafer patterning and a control circuit wafer which is combined with the light receiving and emitting unit by vertical bonding to be operated as a single chip device, in which the control circuit wafer is connected to the light emitting unit and the light receiving unit.

17 Claims, 12 Drawing Sheets

Micro lens array

(51) Int. Cl.
     *H01S 5/02253*     (2021.01)
     *H01S 5/0239*      (2021.01)
     *H01S 5/042*       (2006.01)

(56)                    References Cited

FOREIGN PATENT DOCUMENTS

KR    10-2017-0046557  A    5/2017
KR    10-2019-0040832  A    4/2019

OTHER PUBLICATIONS

Korean Office Action issued on Dec. 29, 2021 in counterpart Korean
Patent Application No. 10-2020-0153154 (6 pages in Korean).

* cited by examiner

WIRING

LD

PD

CONTROL
CIRCUIT

110

113 — PD

112 — LD

111 — Substrate

Wafer

Figure 6:
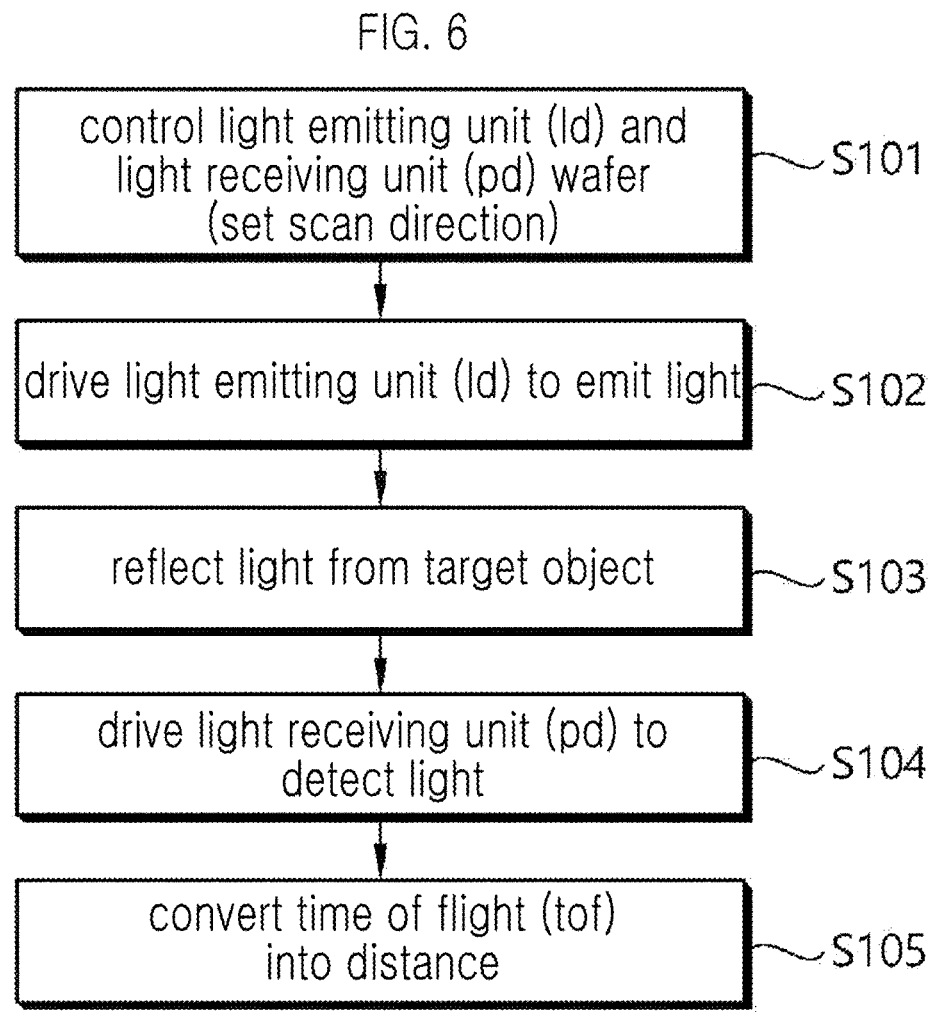

FIG. 6 control light emitting unit (ld) and
light receiving unit (pd) wafer
(set scan direction) — S101 drive light emitting unit (ld) to emit light — S102 reflect light from target object — S103 drive light receiving unit (pd) to
detect light — S104 convert time of flight (tof)
into distance — S105

Wafer–wafer
bond 3D vias

W plugs

Bond
pads

Tier 3

Tier 2

Tier 1

FIG. 19

| PD |
| --- |
| LD |
| Substrate |

110

120 — control circuit wafer

FIG. 20

130 — Lens

| PD |
| --- |
| LD |
| Substrate |

110

120 — control circuit wafer

INTEGRATED LIGHT RECEIVING AND EMITTING DEVICE COMBINED WITH CONTROL CIRCUIT WAFER AND METHOD THEREOF

CROSS-REFERENCE TO RELATED APPLICATIONS

This application claims the priority of Korean Patent Application No. 10-2020-0153154 filed on Nov. 16, 2020, in the Korean Intellectual Property Office, the disclosure of which is incorporated herein by reference.

BACKGROUND

Field

The present disclosure relates to an integrated light receiving and emitting device combined with a control circuit wafer and a manufacturing method thereof.

Description of the Related Art

Light detection and ranging (LiDAR) technique three-dimensionally recognizes a target by sensing light which is reflected from an object to return after emitting laser to the front direction. LiDAR is a technique which implements the three-dimensionally recognized object as data to recognize surrounding objects and is an essential element for level 3 or higher autonomous driving (level without having driver intervention). When LiDAR is used, the object can be measured as a precise three-dimensional shape, as compared with the camera or radar and a positional error is within several centimeters so that it is very reliable as compared with GPS (global positional system) having a positional error of 1 m.

Application of a mechanical LiDAR of the related art has two limits. The first limit is price: Mechanical precision parts in the LiDAR are main elements which hinder the price decline and most of the components are optical elements such as a motor and a mirror which are used to control a direction of the laser beam. The second limit is durability: A driver of the mechanical LiDAR of the related art has the weakest durability and determines the lifespan of the sensor. A general lifespan is approximately 1000 to 2000 hours. It is expected that this limit is solved by a non-mechanical fixed LiDAR. The price will be lowered from about 80 million won to hundreds of thousands of won, and the lifespan is also expected to reach the semi-permanent level of 100,000 hours.

The LiDAR sensor application industries are also utilized not only in autonomous vehicle-related field, but also in robots, motion/gesture recognition sensors, 3D scanner equipment, wheelchair operation for the disabled, guidance equipment for the visually impaired, security systems, and the like.

FIG. 1 is a view illustrating a light receiving and emitting device equipped in a LiDAR of the related art.

As illustrated in FIG. 1, a light emitting unit (laser diode, LD) and a light receiving unit (photo diode, PD) equipped in the LiDAR or the related art, which are independently provided in a device, have limits. Since the LiDAR of the related art which uses the light emitting unit LD and the light receiving unit PD includes a lens system so that a manufacturing price is high due to the alignment issue and there is a limit on the durability due to external impact when it is used for a mobile device.

When the light emitting unit LD and the light receiving unit PD are independently provided in a device, the LD and the PD need to be additionally disposed and an additional combining process with a control circuit is necessary. This leads to the increase in the process steps and the increase in a space occupied by the entire device.

Accordingly, the devices of the related art have problems in that the light emitting unit and the light receiving unit are independent from each other so that chips for the light emitting unit and the light receiving unit need to be separately provided.

In a biaxial structure of the related art in which the light emitting unit and the light receiving unit are provided with a distance therebetween, light alignment is necessary, and the lens structure needs to be independently produced.

Further, in order to connect the device of the related art in which the light emitting unit and the light receiving unit are independently provided with a control circuit, a wire bonding process is additionally required, which increases the space occupied by the device.

SUMMARY

Exemplary embodiments of the present disclosure provide an integrated light receiving and emitting device combined with a control circuit wafer and a manufacturing method thereof to vertically implement a light emitting unit and a light receiving unit on a single semiconductor substrate by wafer patterning and save a device space by vertically bonding the light receiving and emitting unit and a control circuit waver.

Exemplary embodiments of the present disclosure provide an integrated light receiving and emitting device combined with a control circuit wafer and a manufacturing method thereof to implement a light receiving and emitting device formed of a single chip in the unit of wafers by additionally coupling a lens to a structure in which the light receiving and emitting unit and a control circuit wafer are combined.

However, the problems to be solved by the present disclosure are not limited thereto and may be variously, expanded in an environment without departing from the spirit and the scope of the present disclosure.

According to an aspect of the present disclosure, an integrated light receiving and emitting device combined with a control circuit wafer may include a light receiving and emitting unit which includes a single semiconductor substrate and has an integrated wafer structure in which a light emitting unit and a light receiving unit are vertically formed on one surface of the single semiconductor substrate by means of wafer patterning; and a control circuit wafer which is combined with the light receiving and emitting unit by vertical bonding to be operated as a single chip device, in which the control circuit wafer is connected to the light emitting unit and the light receiving unit to control light receiving and emitting operations of the light emitting unit and the light receiving unit.

After epitaxially growing the light emitting unit on the single semiconductor substrate, the light receiving unit may be formed on the grown light emitting unit by a continuous process.

After epitaxially growing the light receiving unit on the single semiconductor substrate, the light emitting unit may be formed on the grown light receiving unit by a continuous process.

The light emitting unit and the light receiving unit may be vertically formed on one surface of the single semiconductor substrate to have a coaxial structure or a non-coaxial structure.

The control circuit wafer may be combined with the light receiving and emitting unit on the other surface of the single semiconductor substrate by vertical bonding to be operated as a single chip device.

The control circuit wafer may be connected to the light emitting unit and the light receiving unit by an on-chip via structure.

The control circuit wafer may be connected to the light emitting unit and the light receiving unit by an on-chip wiring structure.

The control circuit wafer may be turned over to be combined with the light emitting unit and the light receiving unit in the form of flip chip.

The control circuit wafer may be electrically connected to the light emitting unit and the light receiving unit using a solder ball.

The integrated light receiving and emitting device may further include a lens which is combined on the light receiving and emitting unit by vertical bonding.

The control circuit wafer may control the light receiving and emitting operation of the light receiving and emitting unit to scan according to any one control method of sequential driving, non-sequential driving, group setting, row driving, and column driving.

According to another aspect of the present disclosure, a manufacturing method of an integrated light receiving and emitting device combined with a control circuit wafer may include forming a single semiconductor substrate and forming a light receiving and emitting unit having an integrated wafer structure in which a light emitting unit and a light receiving unit are vertically formed on one surface of the single semiconductor substrate by means of wafer patterning; combining a control circuit wafer with the light receiving and emitting unit by vertical bonding to be operated as a single chip device; and connecting the light emitting unit and the light receiving unit to the control circuit wafer to control the light receiving and emitting operation of the light emitting unit and the light receiving unit.

In the forming of a light receiving and emitting unit, after epitaxially growing the light emitting unit on the single semiconductor substrate, the light receiving unit may be formed on the grown light emitting unit by a continuous process.

In the forming of a light receiving and emitting unit, after epitaxially growing the light receiving unit on the single semiconductor substrate, the light emitting unit may be formed on the grown light receiving unit by a continuous process.

In the forming of a light receiving and emitting unit, the light emitting unit and the light receiving unit are vertically formed on one surface of the single semiconductor substrate to have a coaxial structure or a non-coaxial structure.

The control circuit wafer may be combined with the light receiving and emitting unit on the other surface of the single semiconductor substrate by vertical bonding to be operated as a single chip device.

In the connecting to a control circuit wafer, the control circuit wafer may be connected to the light emitting unit and the light receiving unit by an on-chip via structure.

In the connecting to a control circuit wafer, the control circuit wafer may be connected to the light emitting unit and the light receiving unit by an on-chip wiring structure.

In the connecting to a control circuit wafer, the control circuit wafer may be turned over to be combined with the light emitting unit and the light receiving unit in the form of flip chip.

In the connecting to a control circuit wafer, the control circuit wafer may be electrically connected to the light emitting unit and the light receiving unit using a solder ball.

The method may further include combining a lens on the light receiving and emitting unit by the vertical bonding.

The present disclosure has the following effects. However, it does not mean that a specific embodiment should include all the following effects or only the following effects so that it is understood that the scope of the disclosed technology is not limited thereby.

According to the exemplary embodiments of the present disclosure, the light emitting unit and the light receiving unit are vertically implemented on one substrate by means of wafer patterning to save a device space.

According to the exemplary embodiments of the present disclosure, the light receiving and emitting unit is vertically bonded to the control circuit wafer to reduce a device size.

According to the exemplary embodiments of the present disclosure, a co-axial structure or a non-coaxial structure of the light emitting unit and the light receiving unit may maximize a light reception efficiency.

In the related art, the horizontal bonding process of the light receiving and emitting device and the control circuit is additionally necessary, but according to the exemplary embodiments of the present disclosure, the process may be simplified by the vertical bonding of the light receiving and emitting unit and the control circuit wafer in the unit of wafers.

According to the exemplary embodiments of the present disclosure, the lens is additionally combined with a structure in which the light receiving and emitting unit and the control circuit wafer are combined to implement a light receiving and emitting device formed of a single chip in the unit of wafers.

BRIEF DESCRIPTION OF THE DRAWINGS

The above and other aspects, features and other advantages of the present disclosure will be more clearly understood from the following detailed description taken in conjunction with the accompanying drawings, in which:

FIGS. 5 and 6 are views illustrating a micro lens array and an operation algorithm according to a lens direction;

FIGS. 17 and 13 are views illustrating a configuration of an integrated light receiving and emitting device connected in the form of flip chip according to another exemplary embodiment of the present disclosure;

FIGS. 19 and 20 are views illustrating a configuration of an integrated light receiving and emitting device connected with a lens according to another exemplary embodiment of the present disclosure.

DETAILED DESCRIPTION OF THE EMBODIMENT

Figures 1, 2:
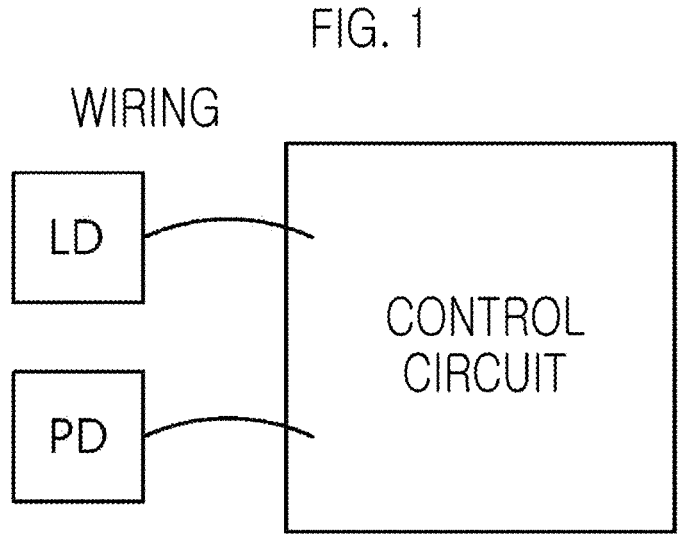
FIG. 1 is a view illustrating a light receiving and emitting device equipped in a LiDAR of the related art.
FIG. 2 illustrates a light receiving and emitting integrated wafer structure according to an exemplary embodiment of the present disclosure.

Those skilled in the art may make various modifications to the present invention and the present invention may have various embodiments thereof, and thus specific embodiments will be illustrated in the drawings and described in detail in detailed description. However, this does not limit the present invention within specific exemplary embodiments, and it should be understood that the present invention covers all the modifications, equivalents and replacements within the spirit and technical scope of the present invention. In describing the present invention, when it is determined that a detailed description of related well-known technology may obscure the gist of the present invention, the detailed description thereof will be omitted.

Terms such as first or second may be used to describe various components, but the components are not limited by the above terms. The above terms are used only to discriminate one component from the other component.

Terms used in the following description are used to describe a specific exemplary embodiment but are not intended to limit the present invention. Terminologies used in the specification are selected from general terminologies which are currently and widely used as much as possible while considering a function in the present invention, but the terminologies may vary in accordance with the intention of those skilled in the art, custom, or appearance of new technology. Further, in particular cases, the terminologies are arbitrarily selected by an applicant and in this case, the meaning thereof may be described in a corresponding section of the description of the invention. Therefore, the terminology used in the specification is analyzed based on a substantial meaning of the terminology and the specification rather than a simple title of the terminology.

A singular form may include a plural form if there is no clearly opposite meaning in the context. In the present application, it should be understood that the terry: "include" or "have" indicates that a feature, a number, a step, an operation, a component, a part or the combination those of described in the specification is present, but do not exclude a possibility of presence or addition of one or more other features, numbers, steps, operations, components, parts or combinations, in advance.

Hereinafter, exemplary embodiments according to the present invention will be described in detail with reference to the accompanying drawings, and the same or corresponding constituent elements are denoted by the same reference numerals regardless of a sign of the drawing, and repeated description thereof will be omitted.

FIG. 2 illustrates a light receiving and emitting integrated wafer structure according to an exemplary embodiment of the present disclosure.

As illustrated in FIG. 2, a light receiving and emitting unit 110 is formed as an integrated wafer in which a light emitting unit 112 and a light receiving unit 113 are vertically provided on a single semiconductor substrate 111. The light receiving and emitting unit 110 includes a single semiconductor substrate 111 and has an integrated wafer structure in which the light emitting unit 112 and the light receiving unit 113 are vertically formed on one surface of the single semiconductor substrate 111.

Figure 3:
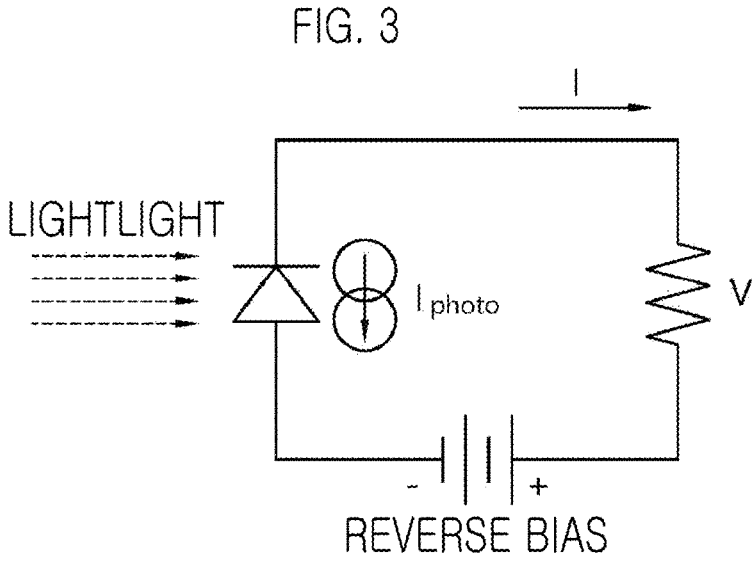
FIGS. 3 and 4 are views illustrating a driving principle of a light emitting unit.
Figure 4:
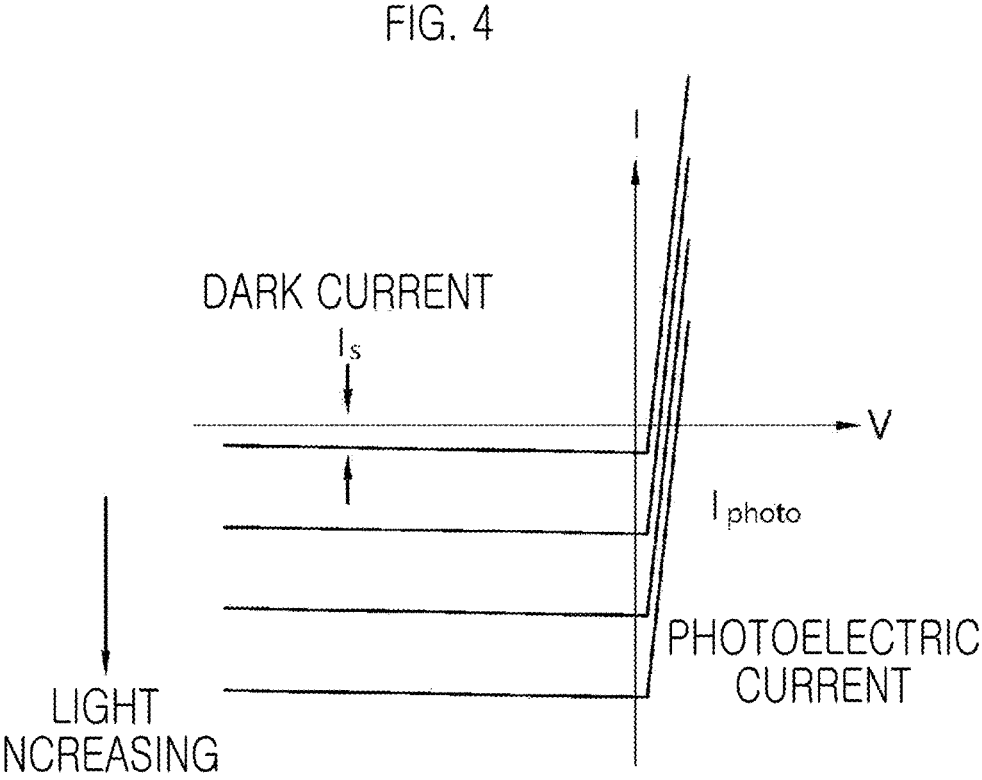

FIGS. 3 and 4 are views illustrating a driving principle of a light emitting unit.

Functions and an operation algorithm of the light emitting unit, the light receiving unit and a control circuit will be described.

First, the light emitting unit (LASER diode, LL) will be described. When a forward bias is applied to a PN junction diode, electrons having a high energy level and holes having a low level are coupled and energy corresponding to the energy difference is generated as light. At this time, when the generated light energy is amplified by configuring a resonator, it is called laser. The LD is a PN junction semiconductor chip and a resonator is configured by providing mirrors on and below a light-generated surface and light is amplified to generate laser. By doing this, light having the same properties such as wavelengths and phases is output so that the coherent characteristic may be provided.

Next, the light receiving unit (photo diode, PD) will be described with reference to FIGS. 3 and 4 as follows. As illustrated in FIG. 3, the light receiving unit PD is a semiconductor diode which converts a photo signal into an electric signal and has a semiconductor PN junction device structure in which an operation area is limited to a reverse bias area. When the photon energy of incident light is larger than a bandgap energy of the semiconductor, light absorption occurs in the semiconductor, which results in electron-hole pairs. As illustrated in FIG. 3, when a reverse-biased PN junction is exposed to light, a photoelectric current is increased. At this time, the photoelectric current depends on an amount of light regardless of a reverse bias voltage. Electron-hole carriers generated in a depletion layer are divided according to the reverse bias and generate currents to form photo-electric conversion.

Figure 5:
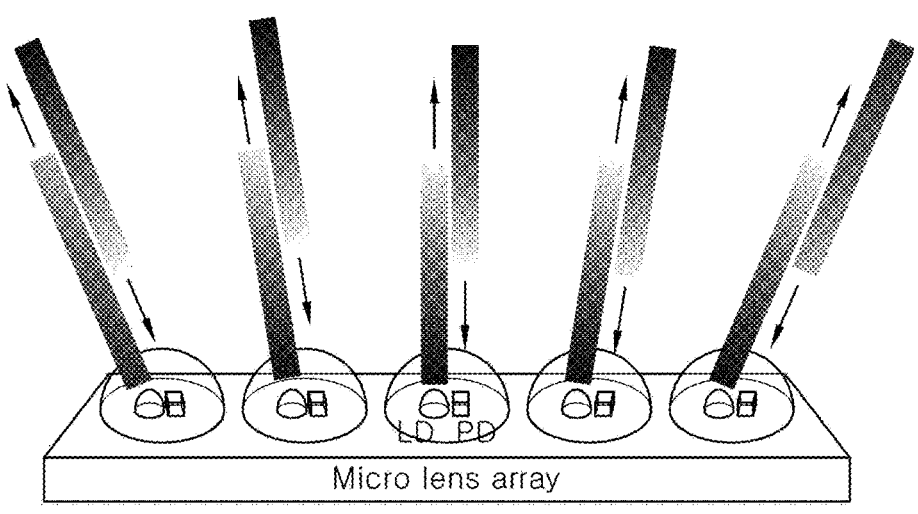

FIGS. 5 and 6 are views illustrating a micro lens array and an operation algorithm according to a lens direction.

As illustrated in FIG. 5, the exemplary embodiment of the present disclosure may be implemented by a micro lens array which generates light along lens directions and detects light reflected from the target object. As illustrated in FIG. 5, the light emitting unit 112 and the light receiving unit 113 are formed to be perpendicular to one surface of the single semiconductor substrate 111 to have a non-coaxial structure.

An operation algorithm will be described with reference to FIG. 6. The light emitting and light receiving operations are performed by the light emitting unit LD and light receiving unit PD pair and then sequentially or non-sequentially performed along each lens direction. Alternatively, the light emitting and light receiving operations may be driven for every row or column. Alternatively, a plurality of light emitting and light receiving operations may be simultaneously performed as a plurality of groups. That is, the light emitting and light receiving operations may be driven by setting a scan method desired by a user.

In step S101, the control circuit controls a light emitting unit LD and light receiving unit PD wafer, to set scan direction.

In step S102, the control circuit drives the light emitting unit LD to emit light.

In step S103, the light emitted from the light emitting unit LD is reflected from the target object.

In step S104, the control circuit drives the light receiving unit PD to detect light.

In step S105, the control circuit converts a time of flight (ToF) for light detected by the light receiving unit PD into a distance.

Figure 7A:
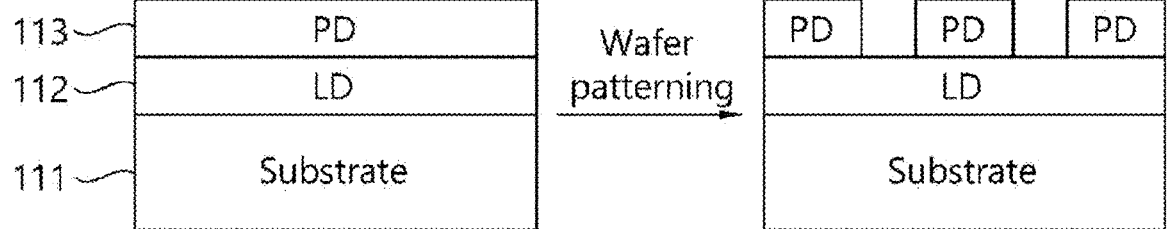
FIGS. 7A and 7B are views illustrating light receiving and emitting integrated wafer patterning used in an exemplary embodiment of the present disclosure.
Figure 7B:
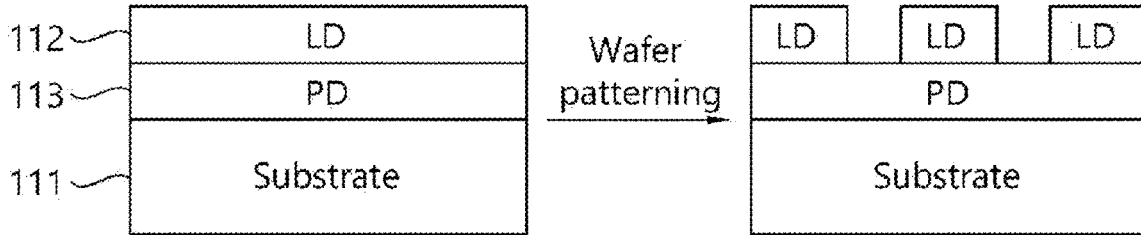

FIGS. 7A and 7B are views illustrating light receiving and emitting integrated wafer patterning used in an exemplary embodiment of the present disclosure.

As illustrated in FIG. 7A, the light receiving and emitting integrated wafer patterning may be performed on a light receiving and emitting unit wafer on which a light emitting unit LD is formed on one semiconductor substrate 111 and a light receiving unit PD is vertically formed thereon. Alternatively, as illustrated in FIG. 7B, the light receiving and emitting integrated wafer patterning may be performed on a light receiving and emitting unit wafer on which a light receiving unit PD is formed on one semiconductor substrate 111 and a light emitting unit LD is vertically formed thereon. The positions of the light emitting unit LD and the light receiving unit PD may be adjusted by the patterning process. By doing this, a single chip light receiving and emitting device may be implemented.

Figure 8:
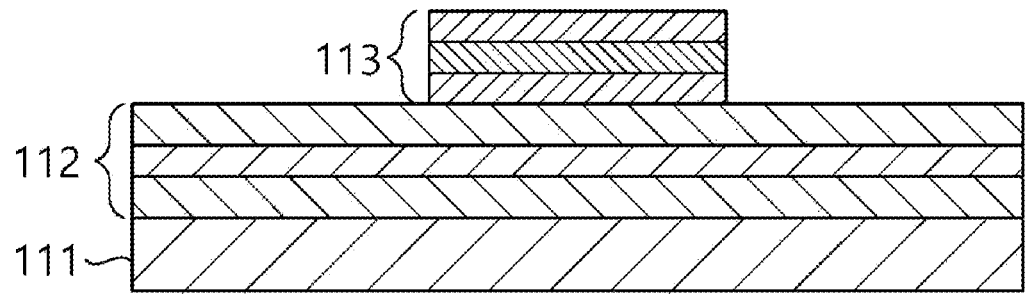
FIGS. 8 and 9 are views illustrating light receiving and emitting integrated wafer patterning used in another exemplary embodiment of the present disclosure.
Figure 9:
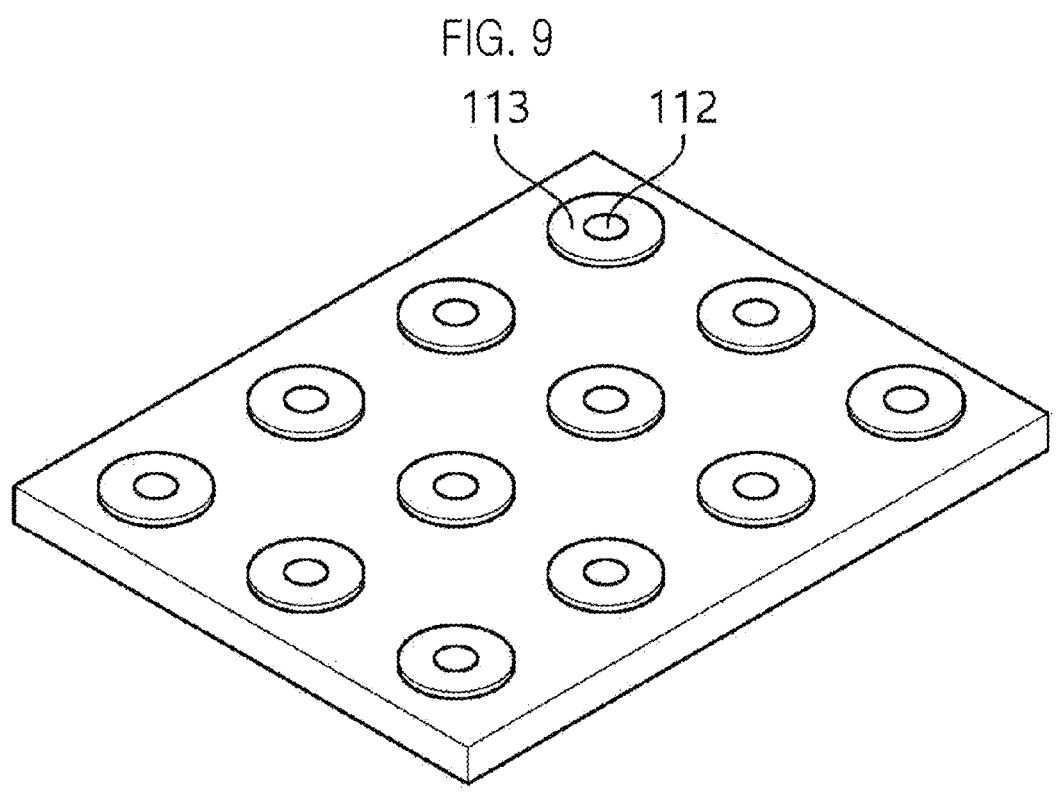
Figure 10:
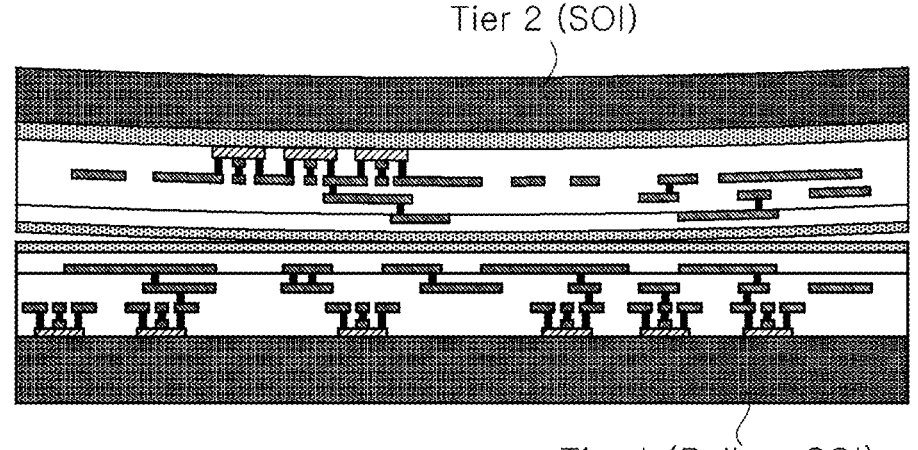
FIGS. 10 to 14 are views illustrating a semiconductor bonding process used in an exemplary embodiment of the present disclosure.
Figure 11:
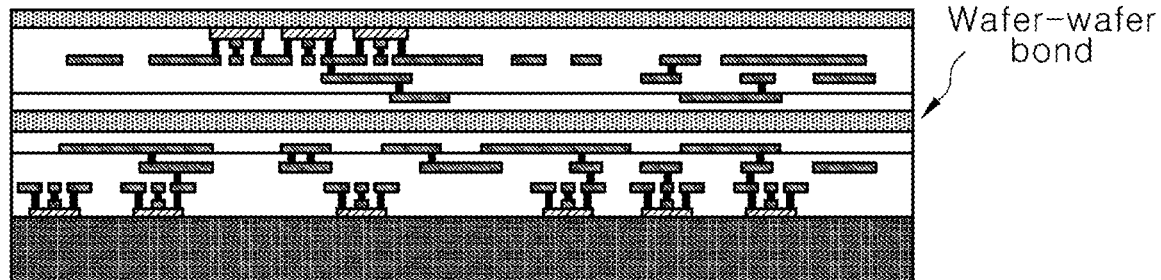
Figure 12:
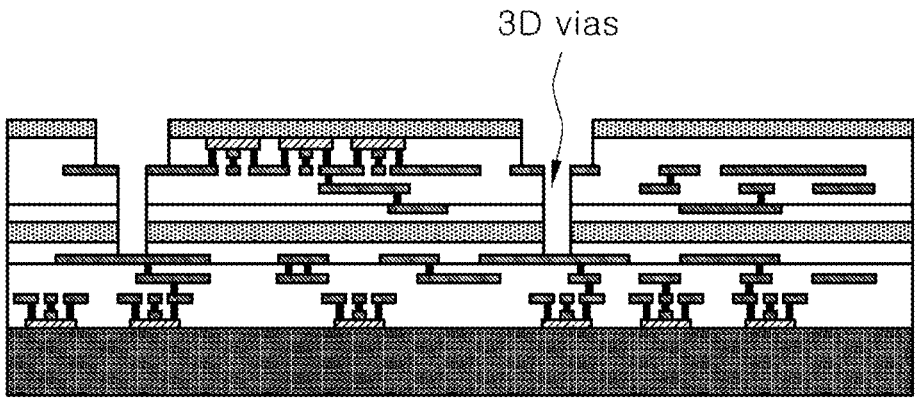
Figure 13:
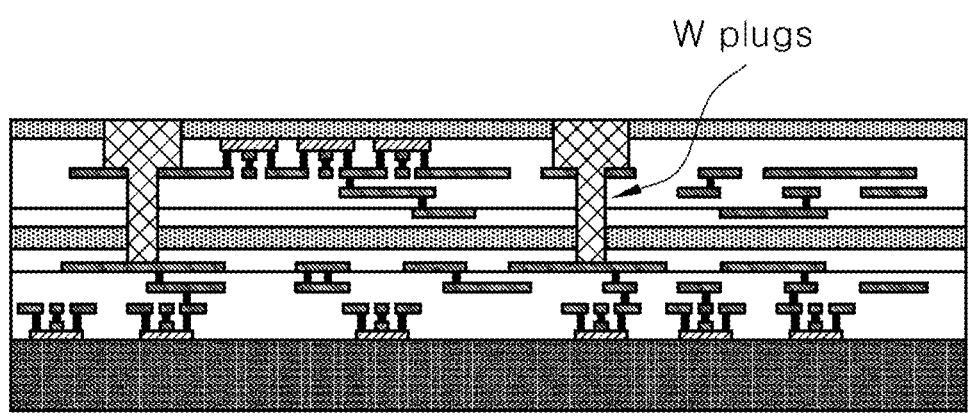
Figure 14:
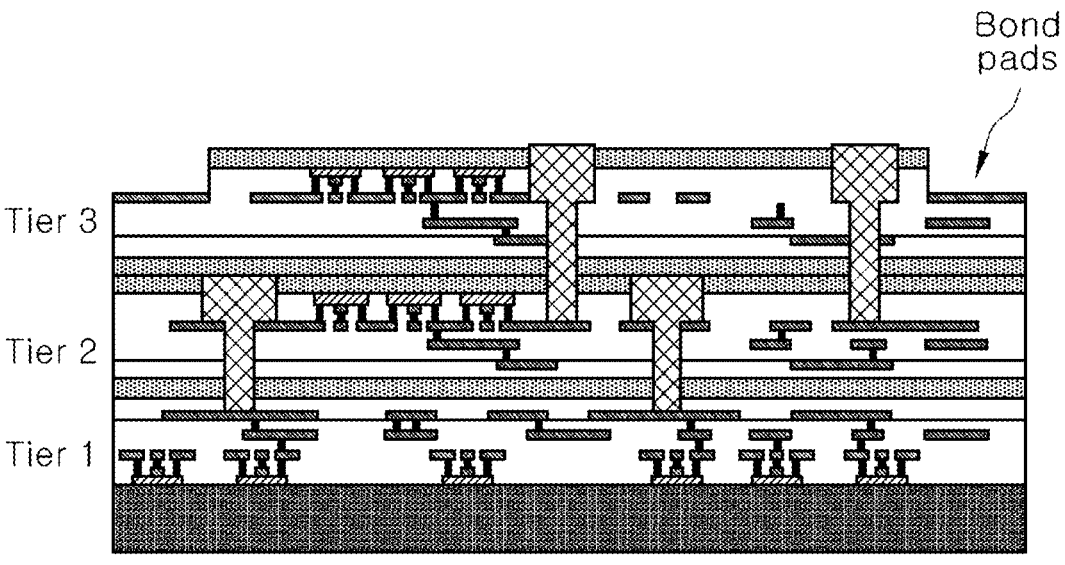

FIGS. 8 and 9 are views illustrating light receiving and emitting integrated wafer patterning used in another exemplary embodiment of the present disclosure.

FIGS. 8 and 9 illustrate a light receiving and emitting unit integrated wafer structure.

A light emitting unit wafer and a light receiving unit wafer are formed on a compound substrate (for example, Group III-V compound) using a metalorganic chemical vapor deposition (MOCVD). In the case of a device in which a light emitting unit and a light receiving unit are independently provided, each substrate is composited and then is subjected to an additional bonding or integration process to be implemented as a device.

In contrast, a single substrate for a light emitting unit and light receiving unit used in the exemplary embodiment of the present discourse has a structure in which the light emitting unit and the light receiving unit (LD/PD) or the light receiving unit and the light emitting unit (PD/LD) are continuously formed on a group III-V compound substrate using MOCVD. After epitaxially growing the light emitting unit (or light receiving unit) on the compound substrate, the light receiving unit (or light emitting unit) is formed thereon by means of a continuous process. That is, the light emitting unit 112 is epitaxially grown on the single semiconductor substrate 111 and then the light receiving unit may be formed on the light emitting unit 112 by means of the continuous process. Alternatively, after epitaxially growing the light receiving unit 113 on the single semiconductor substrate 111, then the light emitting unit 112 may be formed on the light receiving unit 113 by means of the continuous process. The control circuit is implemented on a silicon substrate as formed in the related art.

As illustrated in FIG. 9, the exemplary embodiment of the present disclosure implements a co-axial structure using a light emitting unit and light receiving unit integrated wafer and this wafer is vertically bonded to the control circuit wafer and the lens to reduce a device size. The light emitting unit 112 and the light receiving unit 113 are vertically formed on one surface of the single semiconductor substrate 111 to have a coaxial structure. Alternatively, the light emitting unit 112 and the light receiving unit 113 are vertically formed on one surface of the single semiconductor substrate 111 to have a non-coaxial structure. The light emitting unit 112 and the light receiving unit 113 may be implemented to have a structure desired by the user by means of a wafer patterning process.

FIGS. 10 to 14 are views illustrating a semiconductor bonding process used in an exemplary embodiment of the present disclosure.

As illustrated in FIG. 10 to 14, in the exemplary embodiment of the present disclosure, a semiconductor bonding process using an on-chip via is used.

For example, two wafers (a light emitting unit and light receiving unit integrated wafer and a control circuit wafer) implemented in the exemplary embodiment of the present disclosure may be implemented as a light receiving and emitting device structure combined with a single chip type control circuit wafer by a bonding process in the unit of wafers. Moreover, the optical lens is implemented on the entire wafer to implement an integrated light receiving and emitting device structure to which a lens is additionally combined.

Figure 15:
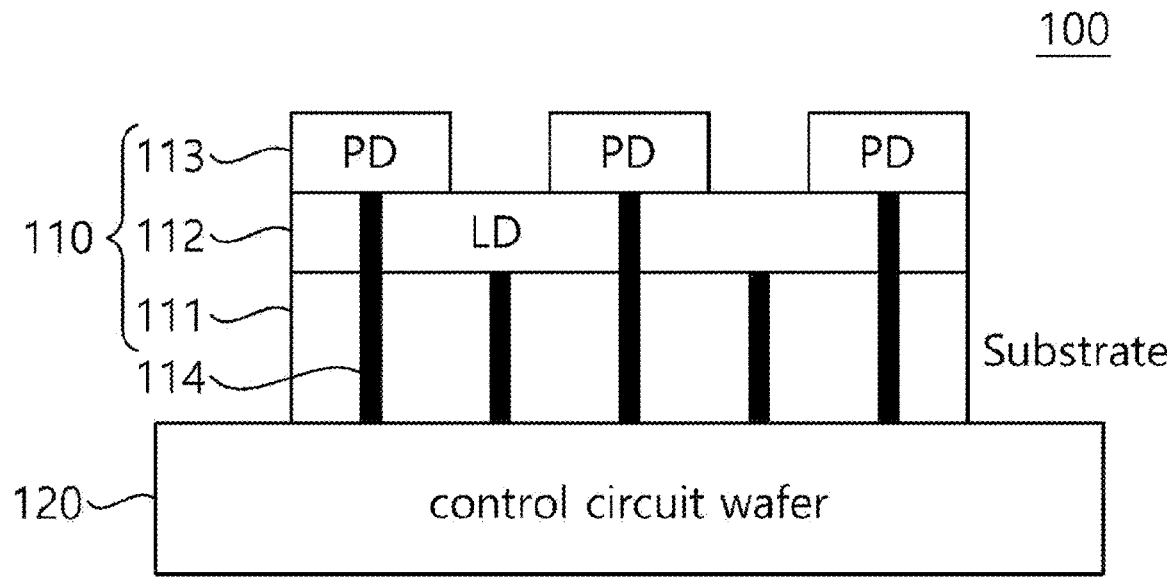
FIGS. 15 and 16 are views illustrating a connection structure of an integrated light receiving and emitting device and a control circuit by an on-chip via and wiring used in an exemplary embodiment of the present disclosure.
Figure 16:
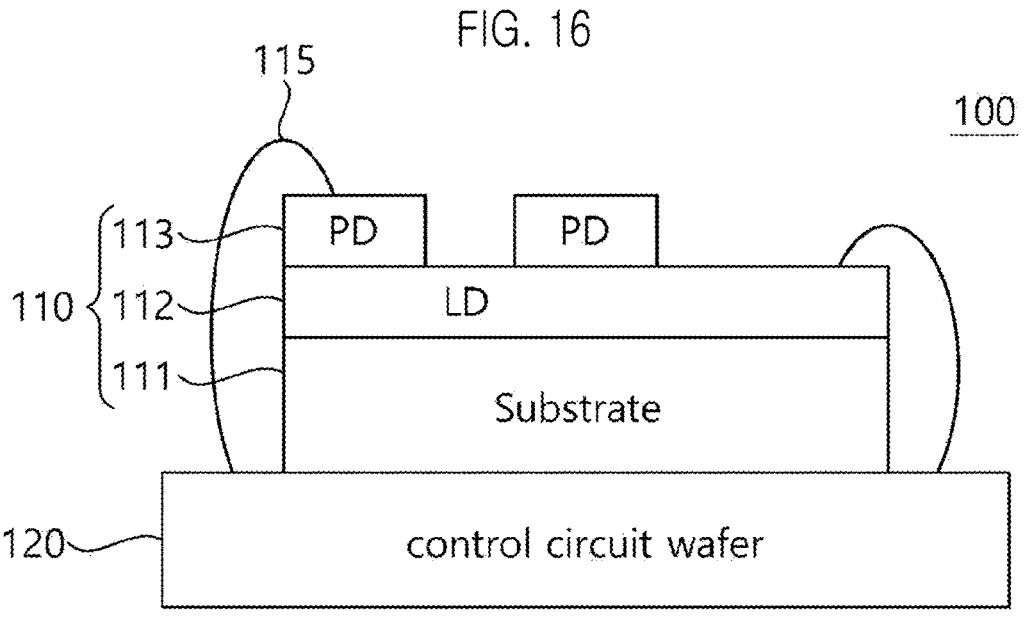

FIGS. 15 and 16 are views illustrating a connection structure of art integrated light receiving and emitting device and a control circuit by an on-chip via and wiring used in an exemplary embodiment of the present disclosure.

An integrated light receiving and emitting device 100 combined with a control circuit wafer according to the exemplary embodiment of the present disclosure includes a light receiving and emitting unit 110 and a control circuit wafer 120. However, not all the illustrated components are essential components. The integrated light receiving and emitting device 100 may be implemented with components more than the illustrated components or may also be implemented with fewer components.

The light receiving and emitting unit 110 has an integrated wafer structure in which the light emitting unit 112 and the light receiving unit 113 are vertically formed on one surface of the single semiconductor substrate 111 by means of wafer patterning.

The control circuit wafer 120 is combined with the light receiving and emitting unit 110 by means of vertical bonding to operate as a single chip device. Here, the control circuit wafer 120 is connected to the light emitting unit 112 and the light receiving unit 113 to control the light receiving and emitting operations of the light emitting unit 112 and the light receiving unit 113. The control circuit wafer 120 is combined with the light receiving and emitting unit 110 on the other surface of the single semiconductor substrate 111 by means of vertical bonding to operate as a single chip device.

The exemplary embodiments of the present disclosure vertically bond the light receiving and emitting unit wafer in which the light emitting unit 112 and the light receiving unit 113 are present to the control circuit wafer to be implemented as a single chip device.

When the exemplary embodiments of the present disclosure are replaced with a single chip sensor using an ultra-high integration of a complementary metal-oxide semiconductor (CMOS) process, mass production with ultra-low cost is possible. The single chip structure of the light emitting unit 112 and the light receiving unit 113 allows the light emitting unit 112 and the light receiving unit 113 to be freely designed and configured and uses a semiconductor process to be very advantageous in terms of size reduction and a manufacturing price. When the light emitting unit 112 and the light receiving unit 113 are configured on one substrate, it is possible to design to reduce the distance therebetween so that ultra-short-distance imaging within 1 m is possible as compared with the assembly method of the related art, which cannot currently perform near-field sensing.

This may be solved by a wafer in which a light emitting unit 112 is formed on one substrate and a light receiving unit 113 is vertically implemented thereon. Further, this may be also solved by a wafer in Which a light receiving unit 113 is formed on one substrate and a light emitting unit 112 is vertically implemented thereon. Positions of the light emitting unit 112 and the light receiving unit 113 may be controlled by the patterning process, which enables a single chip type integrated light receiving and emitting device to be implemented. Moreover, when a control circuit substrate is combined with a lower end of the single wafer in the unit of wafers, the problems of the related art for the additional process and the increased size of the device may be solved.

According to an exemplary embodiment of the present disclosure, FIG. 15 illustrates a configuration of a control circuit wafer which is combined with the integrated light receiving and emitting unit 110 formed by the vertical bonding method, via a via 114.

The light receiving and emitting unit 110 is formed by vertically combining a light emitting unit wafer and a light receiving unit wafer. Thereafter, after bonding the light receiving and emitting unit wafer and the control circuit wafer, a via is formed by lithography and etching, and an electrode is formed. The control circuit wafer may be combined with the light emitting unit 112 and the light receiving unit 113 by means of an on-chip via structure.

According to another exemplary embodiment of the present disclosure, FIG. 16 illustrates a configuration of a control circuit wafer which is combined with the integrated light receiving and emitting unit formed by the vertical bonding method, via wiring 115.

The light receiving and emitting unit 110 is formed by vertically combining a light emitting unit wafer and a light receiving unit wafer. Thereafter, after bonding the light receiving and emitting unit wafer and the control circuit wafer, the light emitting unit wafer and the light receiving unit wafer of the light receiving and emitting unit wafer and the control circuit wafer are connected to each other by the wire bonding. The control circuit wafer may be connected to the light emitting unit 112 and the light receiving unit 113 by means of an on-chip wiring structure.

Figures 17, 18:
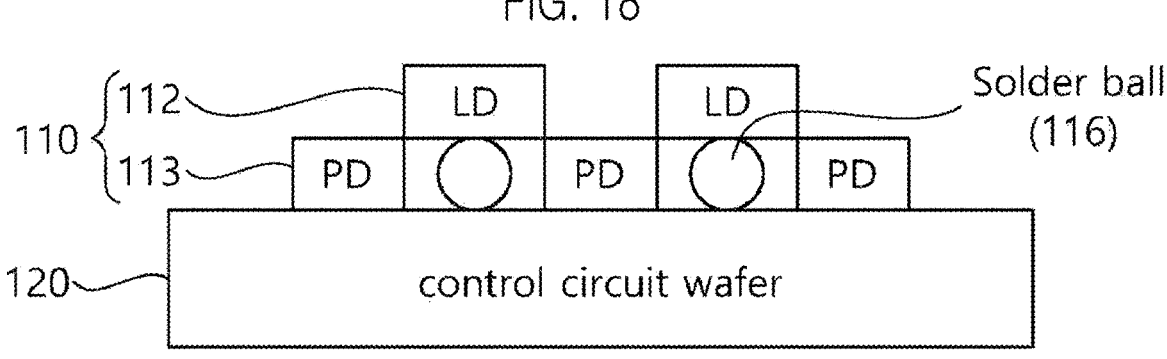

FIGS. 17 and 18 are views illustrating a configuration of an integrated light receiving and emitting device connected in the form of flip chip according to another exemplary embodiment of the present disclosure.

As illustrated in FIG. 17, the light receiving and emitting unit 110 is connected to the control circuit wafer in form of a flip chip. The light emitting unit 112 and the light receiving unit 113 are turned over in form of a flip chip to be combined with the control circuit wafer. That is, the light emitting unit 112 and the light receiving unit 113 formed on one surface of the single semiconductor substrate 111 are turned over in form of a flip chip to be combined with the control circuit wafer. The same process as a general semiconductor substrate bonding process is performed. The light emitting unit and receiving unit wafer is turned over to be combined with the control circuit wafer. Here, the light emitting unit and receiving unit wafer may be connected with the control circuit wafer by means of solder balls formed in the light emitting unit 112 and the light receiving unit 113. That is, the turned-over light emitting unit and light receiving unit and the control circuit wafer are electrically connected using a solder ball.

Thereafter, as illustrated in FIG. 18, semiconductor substrate etching is performed to operate the light receiving and emitting unit 110.

Figures 19, 20:
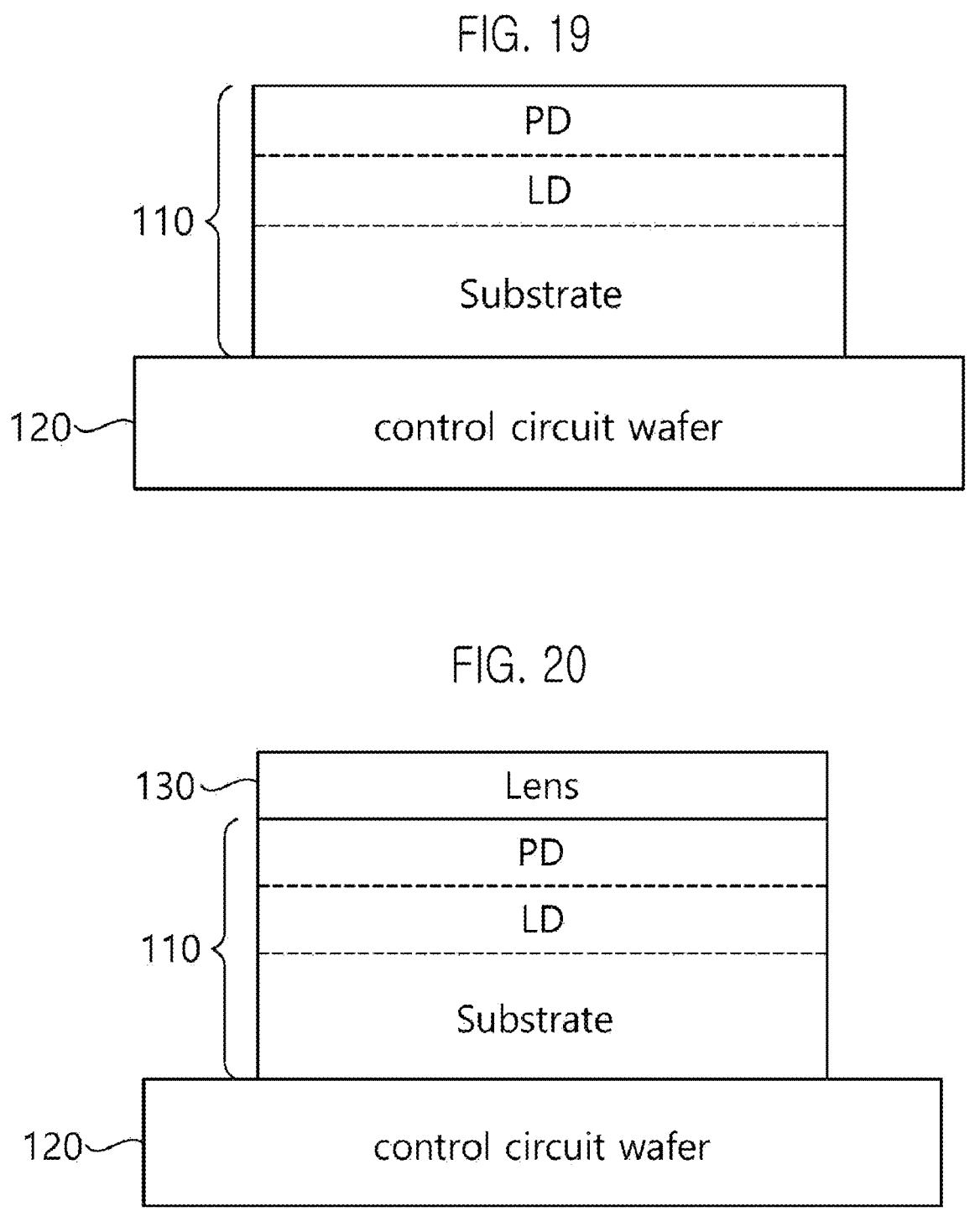

FIGS. 19 and 20 are views illustrating a configuration of an integrated light receiving and emitting device combined with a lens according to another exemplary embodiment of the present disclosure.

FIG. 19 illustrates a unit structure of an integrated light receiving and emitting device 100 in which a light receiving unit and light emitting unit integrated wafer and a control circuit wafer are combined.

FIG. 20 illustrates another exemplary embodiment of the present disclosure in which a lens 130 is combined with a unit structure of the integrated light receiving and emitting device 100.

Figure 21:
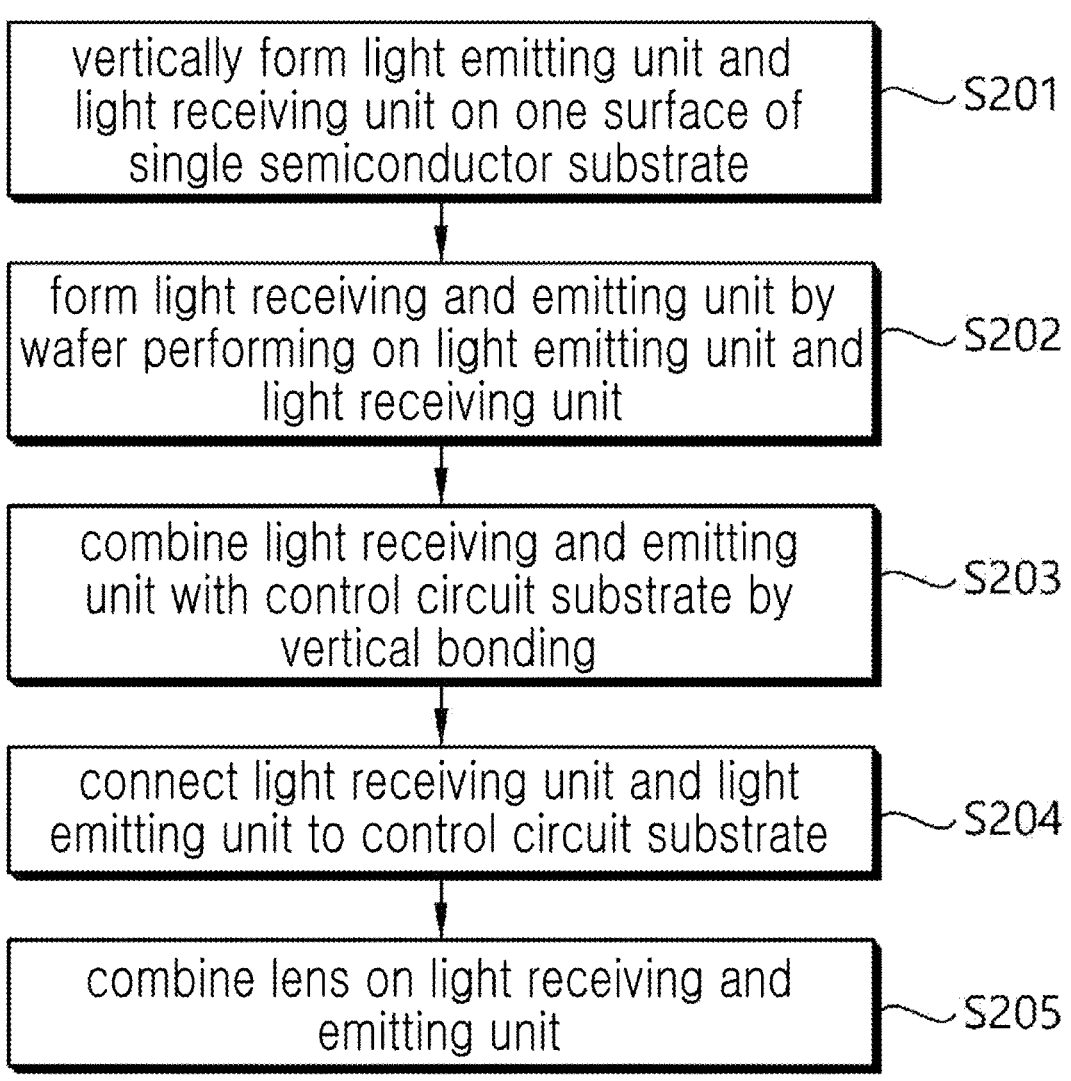
FIG. 21 is a flowchart of a manufacturing method of an integrated light receiving and emitting unit combined with a control circuit wafer according to an exemplary embodiment of the present disclosure.

FIG. 21 is a flowchart of a manufacturing method of an integrated light receiving and emitting device combined with a control circuit wafer according to an exemplary embodiment of the present disclosure.

In step S201, according to the manufacturing method of an integrated light receiving and emitting device, a light emitting unit 112 and a light receiving unit 113 are vertically formed on one surface of the single semiconductor substrate 111.

In step S202, according to the manufacturing method of an integrated light receiving and emitting device, the light emitting unit 112 and the light receiving unit 113 are subjected to the wafer patterning to form a light receiving and emitting unit 110.

In step S203, according to the manufacturing method of an integrated light receiving and emitting device, the light receiving and emitting unit 110 and the control circuit wafer are combined by the vertical bonding.

In step S204, according to the manufacturing method of an integrated light receiving and emitting device, the light emitting unit 112 and the light receiving unit 113 are connected to the control circuit wafer.

In step S205, according to the manufacturing method of an integrated light receiving and emitting device, a lens 130 is combined on the light receiving and emitting unit 110 by the vertical bonding.

Exemplary embodiments of the present disclosure may be directly applicable to various fields such as autonomous vehicles, robotics, drones, machine visions, and AV&VR.

In the meantime, according to an exemplary embodiment of the present disclosure, various exemplary embodiments described above may be implemented by software including instructions stored in machine (for example, computer)-readable storage media. The device is an apparatus which calls the stored instruction from the storage media and operates according to the called instruction and includes electronic device (for example, electronic device A) according to the disclosed exemplary embodiments. When the instruction is executed by a processor, the processor may perform the function corresponding to the instruction, directly or using other components under the control of the processor. The instruction may include a code which is generated or executed by a compiler or an interpreter. The machine-readable storage media may be provided as non-transitory storage media. Here, "non-transitory" means that the storage media do not include signals, but are tangible, but do not distinguish that the data is semi-permanently or temporarily stored in the storage media.

Further, according to an exemplary embodiment of the present disclosure, the method according to various exemplary embodiments described above may be provided to be included in a computer program product. The computer program product may be traded between sellers and buyers as commodities. The computer program products may be distributed in the form of machine-readable storage media (for example, a compact disc read only memory (CD-ROM)) or online through an application store (for example, Play-store™). In the case of online distribution, at least some computer program products may be temporarily stored in storage media such as a memory of a server of a manufacturer, a server of an application store, or a relay server or temporarily created.

Further, according to an exemplary embodiment of the present disclosure, various exemplary embodiments described above may be implemented in computer or similar device readable recording media using software, hardware, or combination thereof. In some cases, the exemplary embodiments described in the present specification may be implemented as a processor itself. According to the software implementation, exemplary embodiments such as the procedures and functions described in this specification may be implemented as separate software modules. Each of the software modules may perform one or more functions and operations described in this specification.

In the meantime, computer instructions for performing the processing operation of the device according to the various embodiments described above may be stored in a non-transitory computer-readable medium. When the computer instructions stored in the non-transitory computer-readable medium are executed by the processor of the specific device, the computer instructions cause the specific device to perform the processing operation in the device according to the various embodiments described above. The non-transitory computer-readable medium refers to a medium that stores data semi-permanently and is readable by the device, rather than a medium that stores data for a short moment, such as registers, caches, and memories. Specific examples of the non-transitory computer-readable medium may include a CD, DVD, hard disk, Blu-ray disk, USB, memory card, ROM, and the like.

In addition, each of the components (for example, a module or a program) according to the above-described various embodiments may be configured by a single or a plurality of entities, and some sub-components of the above-described sub-components may be omitted, or other sub-components may be further included in various embodiments. Alternatively or additionally, some components (for example, modules or programs) may be integrated into a single entity to perform the same or similar functions performed by each corresponding component before being integrated. Operations performed by a module, a program, or other components, according to various embodiments, are executed sequentially, parallelly, iteratively, or heuristically, or at least some operations may be executed in a different order, be omitted, or other operations may be added.

Preferred embodiments of the present invention have been illustrated and described above, but the present invention is not limited to the above-described specific embodiments, it is obvious that various modification may be made by those skilled in the art, to which the present invention pertains without departing from the gist of the present invention, which is claimed in the claims, and such modification should not be individually understood from the technical spirit or prospect of the present invention.

What is claimed is:

1. An integrated light receiving and emitting device, comprising:
   a light receiving and emitting unit having an integrated wafer structure and including:

a single semiconductor substrate; and
   a light emitting unit and a light receiving unit that are vertically formed on a surface of the single semiconductor substrate by wafer patterning;
   a control circuit wafer combined with the light receiving and emitting unit by vertical bonding to operate as a single chip device,
   wherein the control circuit wafer is directly electrically connected to the single semiconductor substrate at another surface of the single semiconductor substrate, without any intervening substrate or electro-optic element between the control circuit wafer and the another surface of the single semiconductor substrate, and is electrically connected through the single semiconductor substrate to the light emitting unit and the light receiving unit and configured to control light receiving and emitting operations of the light emitting unit and the light receiving unit; and
   a micro lens array disposed to optically couple the light emitting unit and the light receiving unit to an exterior region, the micro lens array defining a plurality of lens directions, wherein the control circuit wafer is further configured to perform light emitting and light receiving operations along the plurality of lens directions by selecting a lens direction.

2. The integrated light receiving and emitting device according to claim 1, wherein the light emitting unit is epitaxially grown on the single semiconductor substrate, and wherein the light receiving unit is formed on the grown light emitting unit by a continuous process.

3. The integrated light receiving and emitting device according to claim 1, wherein the light receiving unit is epitaxially grown on the single semiconductor substrate, and wherein the light emitting unit is formed on the epitaxially grown light receiving unit by a continuous process.

4. The integrated light receiving and emitting device according to claim 1, wherein the light emitting unit and the light receiving unit are vertically formed on one surface of the single semiconductor substrate to have a coaxial structure or a non-coaxial structure.

5. The integrated light receiving and emitting device according to claim 1, wherein the control circuit wafer is combined with the light receiving and emitting unit on the another surface of the single semiconductor substrate by the vertical bonding to be operated as a single chip device.

6. The integrated light receiving and emitting device according to claim 5, wherein the control circuit wafer is connected to the light emitting unit and the light receiving unit by an on-chip via structure.

7. The integrated light receiving and emitting device according to claim 5, wherein the control circuit wafer is connected to the light emitting unit and the light receiving unit by an on-chip wiring structure.

8. The integrated light receiving and emitting device according to claim 1, further comprising:
   a lens combined on the light receiving and emitting unit by the vertical bonding.

9. The integrated light receiving and emitting device according to claim 1, wherein the control circuit wafer is further configured to control the light receiving and emitting operation of the light receiving and emitting unit to scan according to any one control method of sequential driving, non-sequential driving, group setting, row driving, and column driving.

10. A manufacturing method of an integrated light receiving and emitting device, the manufacturing method comprising:

forming a light receiving and emitting unit having an integrated wafer structure by:

forming a single semiconductor substrate; and vertically forming a light emitting unit and a light receiving unit on a surface of the single semiconductor substrate by wafer patterning;

combining a control circuit wafer with the light receiving and emitting unit by vertical bonding to be operated as a single chip device including directly bonding the control circuit wafer to another surface of the single semiconductor substrate such that no intervening substrate or electro-optic element is disposed between the control circuit wafer and the another surface of the single semiconductor substrate;

electrically connecting the light emitting unit and the light receiving unit to the control circuit wafer through the single semiconductor substrate to control the light receiving and emitting operation of the light emitting unit and the light receiving unit;

combining a micro lens array with the light receiving and emitting unit such that the micro lens array optically couples the light emitting unit and the light receiving unit to an exterior region and defines a plurality of lens directions; and controlling, by the control circuit wafer, light emitting and light receiving operations along the plurality of lens directions by selecting a lens direction.

11. The manufacturing method according to claim 10, wherein in the forming of a light receiving and emitting unit, the light emitting unit is epitaxially grown on the single semiconductor substrate, and wherein the light receiving unit is formed on the grown light emitting unit by a continuous process.

12. The manufacturing method according to claim 10, wherein in the forming of a light receiving and emitting unit, the light receiving unit is epitaxially grown on the single semiconductor substrate, and wherein the light emitting unit is formed on the epitaxially grown light receiving unit by a continuous process.

13. The manufacturing method according to claim 10, wherein in the forming of a light receiving and emitting unit, the light emitting unit and the light receiving unit are vertically formed on one surface of the single semiconductor substrate to have a coaxial structure or a non-coaxial structure.

14. The manufacturing method according to claim 10, wherein the control circuit wafer is combined with the light receiving and emitting unit on the another surface of the single semiconductor substrate by the vertical bonding to be operated as a single chip device.

15. The manufacturing method according to claim 14, wherein in the connecting to a control circuit wafer, the control circuit wafer is connected to the light emitting unit and the light receiving unit by an on-chip via structure.

16. The manufacturing method according to claim 14, wherein in the connecting to a control circuit wafer, the control circuit wafer is connected to the light emitting unit and the light receiving unit by an on-chip wiring structure.

17. The manufacturing method according to claim 10, further comprising:

combining a lens on the light receiving and emitting unit by the vertical bonding.

* * * * *